(«12») United States Patent
Yao

(10) Patent No.: US 9,680,114 B2
(45) Date of Patent: Jun. 13, 2017

(54) FLEXIBLE ORGANIC LIGHT EMITTING DISPLAY AND METHOD FOR MANUFACTURING THE SAME

(71) Applicant: SHENZHEN CHINA STAR OPTOELECTRONICS TECHNOLOGY CO., LTD., Shenzhen, Guangdong (CN)

(72) Inventor: Jiangbo Yao, Guangdong (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 0 days.

(21) Appl. No.: 14/417,744

(22) PCT Filed: Jan. 7, 2015

(86) PCT No.: PCT/CN2015/070267
§ 371 (c)(1),
(2) Date: Jan. 27, 2015

(87) PCT Pub. No.: WO2016/106797
PCT Pub. Date: Jul. 7, 2016

(65) Prior Publication Data
US 2016/0190488 A1    Jun. 30, 2016

(30) Foreign Application Priority Data
Dec. 31, 2014    (CN) .......................... 2014 1 0849194

(51) Int. Cl.
*H01L 29/08*    (2006.01)
*H01L 51/00*    (2006.01)
*H01L 27/32*    (2006.01)

(52) U.S. Cl.
CPC ...... *H01L 51/0097* (2013.01); *H01L 27/3244* (2013.01); *H01L 2227/32* (2013.01)

(58) Field of Classification Search
CPC ............. H01L 27/1218; H01L 27/1225; H01L 27/1255; H01L 27/124; H01L 27/1266
(Continued)

(56) References Cited

U.S. PATENT DOCUMENTS

2003/0034497 A1    2/2003  Yamazaki et al.
2004/0238827 A1*  12/2004  Takayama ........... H01L 27/1214
                                                          257/79
(Continued)

FOREIGN PATENT DOCUMENTS

| CN | 1392615 A   | 1/2003  |
| CN | 101241915 A | 8/2008  |
| CN | 103426904 A | 12/2013 |

*Primary Examiner* — Hung Vu
(74) *Attorney, Agent, or Firm* — Muncy, Geissler, Olds & Lowe, P.C.

(57) ABSTRACT

A flexible organic light emitting display and a method for manufacturing the same are disclosed. The method is: sequentially forming a first buffer layer, a switch array layer, a display unit layer, and a thin film package layer on a flexible underlay substrate. When the flexible organic light emitting display bends along the flexible underlay substrate, a first bending deformation force is generated. The first buffer layer is used to absorb the first bending deformation force, and the material of the first buffer layer is an organic insulating material.

5 Claims, 2 Drawing Sheets

(58) Field of Classification Search
USPC .......................................... 257/40, 43, 59, 72
See application file for complete search history.

(56) References Cited

U.S. PATENT DOCUMENTS

| | | |
|---|---|---|
| 2008/0185588 A1 | 8/2008 | Park et al. |
| 2013/0299789 A1* | 11/2013 | Yamazaki ........... H01L 51/5246 257/40 |
| 2015/0194618 A1 | 7/2015 | Cheng et al. |

* cited by examiner

FLEXIBLE ORGANIC LIGHT EMITTING DISPLAY AND METHOD FOR MANUFACTURING THE SAME

FIELD OF THE INVENTION

The present invention relates to a technical field of displays, and in particular to a flexible organic light emitting display and a method for manufacturing the same.

BACKGROUND OF THE INVENTION

With the development of thin film transistor technology, more and more people have begun to pay attention to flexible display technology, and various kinds of the flexible display technology have also been developed. Nowadays, slit coater technology is generally used. A flexible underlay material (such as polyimide, PI) is coated on a glass substrate and heated to form a flexible underlay substrate, and the substrate is used in the manufacture of the thin film transistor. After manufacturing and tearing off the PI film, the flexible display is acquired. The flexible organic light emitting display is widely used due to the advantages of being lightweight, strong impact, flexible, easy to carry, and so on. However, the flexible organic light emitting display comprises multi-layer metal electrodes, and frequent bending causes fractures or damage of the metal electrodes in the display, also affecting the electrical connection and stability, resulting in reduction of the display effect.

Therefore, a flexible organic light emitting display and its manufacturing method are provided to solve the problems in the conventional art.

SUMMARY OF THE INVENTION

The object of the present invention is to provide a flexible organic light emitting display and its manufacturing method which can solve the technical problem of the metal electrode damage resulting in low display effect during the bending process of the conventional flexible organic light emitting display.

In order to solve the above problem, the technical solution of the present invention is as follows: a method of manufacturing a flexible organic light emitting display, comprising: forming a first buffer layer on a flexible underlay substrate; forming a switch array layer on the first buffer layer, the switch array layer comprises at least two switch components; forming a display unit layer on the switch array layer, the display unit layer comprises at least two pixel units, the pixel unit comprises a first electrode layer, a second electrode layer, an organic light emitting layer disposed between the first electrode layer and the second electrode layer; the switch component is connected with the first electrode layer, and is disposed relative to the pixel unit, a pixel definition layer disposed between two adjacent pixel units, material of the pixel definition layer is an organic insulating material; and forming a second buffer layer on the display unit layer; and forming a thin film package layer on the second buffer layer; wherein when the flexible organic light emitting display bends along of the flexible underlay substrate, a first bending deformation force is generated, the first buffer layer is used to absorb the first bending deformation force, a material of the first buffer layer is an organic insulating material; when the flexible organic light emitting display bends inward along the thin film package layer, a second bending deformation force is generated, the second buffer layer is used to absorb the second bending deformation force, material of the second buffer layer is an organic insulating material.

In the method for manufacturing the flexible organic light emitting display of the present invention, the organic insulating material is composed of a photosensitive agent and resin.

In the method for manufacturing the flexible organic light emitting display of the present invention, a thickness of the first buffer layer is 2 to 10 nm.

In the method for manufacturing the flexible organic light emitting display of the present invention, a thickness of the second buffer layer is 2 to 10 nm.

The present invention discloses a method for manufacturing a flexible organic light emitting display, which comprises: forming a first buffer layer on a flexible underlay substrate; forming a switch array layer on the first buffer layer, the switch array layer comprises at least two switch components; forming a display unit layer on the switch array layer, the display unit layer comprises at least two pixel units, the pixel unit comprises a first electrode layer, a second electrode layer, an organic light emitting layer disposed between the first electrode layer and the second electrode layer; the switch component is connected with the first electrode layer, the switch component disposed relative to the pixel unit; and forming a thin film package layer on the second buffer layer; wherein when the flexible organic light emitting display bends along the flexible underlay substrate, a first bending deformation force is generated, the first buffer layer is used to absorb the first bending deformation force, material of the first buffer layer is an organic insulating material.

In the method for manufacturing the flexible organic light emitting display of the present invention, after a step of forming a display unit layer on the switch array layer, the method further comprises: forming a second buffer layer on the display unit layer; and forming a thin film package layer on the second buffer layer; when the flexible organic light emitting display bends inward along the thin film package layer, a second bending deformation force is generated, the second buffer layer is used to absorb the second bending deformation force, material of the second buffer layer is an insulating material.

In the method for manufacturing the flexible organic light emitting display of the present invention, a pixel definition layer is disposed between two adjacent pixel units, a material of the pixel definition layer is an organic insulating material.

In the method for manufacturing the flexible organic light emitting display of the present invention, the organic insulating material is composed of a photosensitive agent and resin.

In the method for manufacturing the flexible organic light emitting display of the present invention, a thickness of the first buffer layer is 2 to 10 nm.

In the method for manufacturing the flexible organic light emitting display of the present invention, a thickness of the second buffer layer is 2 to 10 nm.

The present invention further provides a flexible organic light emitting display, which comprises: a flexible underlay substrate; a first buffer layer disposed on the flexible underlay substrate; a switch array layer disposed on the first buffer layer, the switch array layer comprises at least two switch components; a display unit layer disposed on the switch array layer, the display unit layer comprises at least two pixel units, the pixel unit comprises a first electrode layer, a second electrode layer, and an organic light emitting layer disposed between the first electrode layer and the second electrode layer; the switch component is connected with the first electrode layer, the switch component is disposed relative to the pixel unit; and a thin film package layer disposed on the display unit layer; wherein when the flexible organic light emitting display bends along the thin film package layer, a second bending deformation force is generated, the second buffer layer is used to absorb the second bending deformation force, a material of the second buffer layer is an insulating material.

In the flexible organic light emitting display, a second buffer layer is disposed between the display unit layer and the thin film package layer; wherein when the flexible organic light emitting display bends along the thin film package layer, a second bending deformation force is generated, the second buffer layer is used to absorb the second bending deformation force, a material of the second buffer layer is an insulating material.

In the flexible organic light emitting display, a pixel definition layer is disposed between two adjacent pixel units, material of the pixel definition layer is an organic insulating material.

In the flexible organic light emitting display, the organic insulating material is composed of a photosensitive agent and resin.

In the flexible organic light emitting display, a thickness of the first buffer layer is 2 to 10 nm.

In the flexible organic light emitting display, a thickness of the second buffer layer is 2 to 10 nm.

The flexible organic light emitting display and the method for manufacturing the same can prevent the metal electrode from damaging during the bending process through disposing the organic insulating buffer layer on the flexible underlay substrate, so as to enhance the stability of the flexible organic light emitting device.

DETAILED DESCRIPTION OF THE PREFERRED EMBODIMENTS

Figure 1:
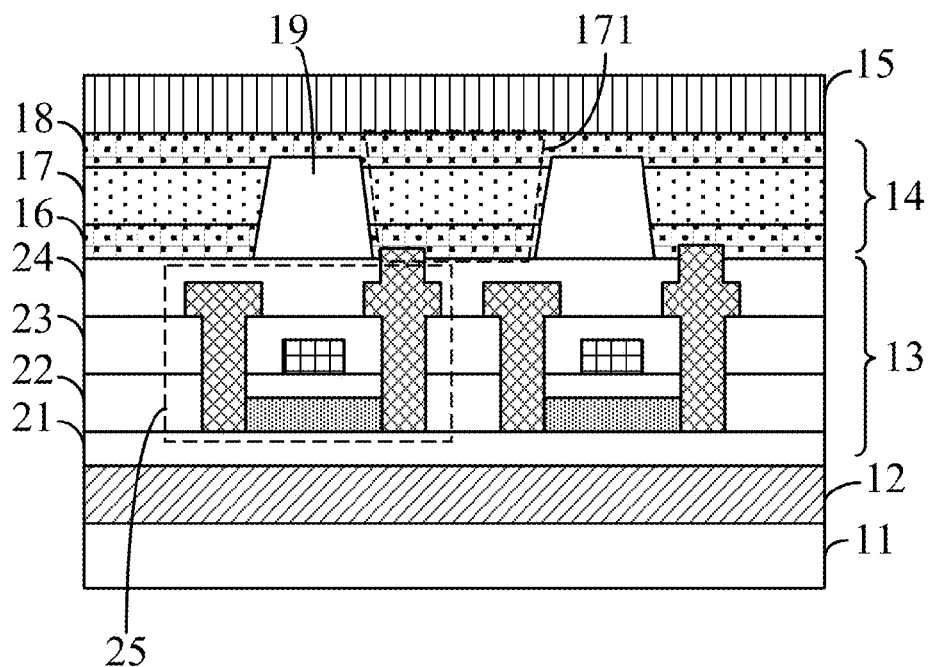
FIG. 1 is a structural schematic diagram of a flexible organic light emitting display according to a first embodiment of the present invention.

The following description of the embodiments with reference to the attached drawings is to be used to illustrate particular embodiments of the present invention. as the directions referred to in the present invention, such as "upper", "lower", "front", "rear", "left", "right", "inner", "outer", "side surface", etc., are only with reference to drawings. Therefore, the directional terms are used for describing and understanding the invention, and are not intended to limit the present invention. In the drawings, similar structural elements are represented by the same reference numerals.

Please refer to FIG. 1, which is a structural schematic diagram of a flexible organic light emitting display according to the first embodiment of the present invention. The flexible organic light emitting display of the present invention as shown in FIG. 1 comprises a flexible underlay substrate 11, a first buffer layer 12 disposed on the flexible underlay substrate 11, a switch array layer 13 disposed on the first buffer layer 12, a display unit layer 14 disposed on the switch array layer 13, and a thin film package layer 15 disposed on the display unit layer 14.

The whole flexible underlay substrate 11 is formed by coating a flexible underlay substrate material on a flat rigid base (such as a glass substrate). The flexible underlay material can be a polyimide, and a slit coating can be used herein. The thickness of the flexible underlay substrate after drying is 10-100 um. Then, electronic elements are disposed on the flexible underlay substrate.

Figure 3:
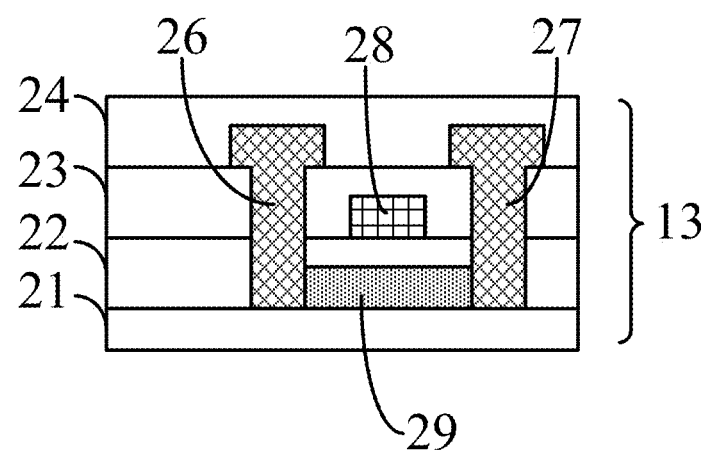
FIG. 3 is a structural schematic diagram of an enlarged switch component of an organic light emitting display of the present invention.

The switch array layer 13 comprises two or more switch components 25. The switch array layer 13 further comprises a third buffer layer 21, a gate insulating layer 22, an interlayer insulating layer 23, and a passivation layer 24. The switch components 25 can be thin film transistors. As shown in FIG. 3, the thin film transistor comprises a source electrode 26, a drain electrode 27, a gate electrode 28 and the active layer 29 disposed between the source electrode and the drain electrode (used as a channel).

The display unit layer 14 comprises at least two pixel units 171. The pixel unit 171 comprises a first electrode layer 16, a second electrode layer 18, and an organic light emitting layer 17 disposed between the first electrode layer 16 and the second electrode layer 18. A pixel definition layer 19 is disposed between two adjacent pixel units and the material of the pixel definition layer is an insulating material. The polarity of the first electrode layer is positive, while the polarity of the second electrode layer is negative. When applying a voltage to the first electrode layer and the second electrode layer, the organic light emitting layer illuminates. The pixel definition layer is used for separating the organic light emitting layers with different colors and avoiding crosstalk between the organic light emitting layers with different colors.

The switch component 25 connects with the first electrode layer 16, and the switch component 25 is disposed relative to the pixel unit 171. Each of the pixel units has one corresponding disposed switch component.

When the flexible organic light emitting display bends along the flexible underlay substrate (downward bending), the first bending deformation force is generated. The first buffer layer is used to absorb the first bending deformation force. The material of the first buffer layer is an organic insulating material.

The method for manufacturing the above mentioned flexible organic light emitting display comprises the following steps:

S201: forming a first buffer layer on the flexible underlay substrate. When the flexible organic light emitting display device bends along the flexible underlay substrate (downward bending), the first bending deformation force is generated The first buffer layer is used to absorb the first bending deformation force. The material of the first buffer layer is an organic insulating material.

S202: forming a switch array layer on the first buffer layer. The switch array layer comprises at least two switch components.

S203: forming a display unit layer on the switch array layer. The display unit layer comprises at least two pixel units, the pixel unit comprises a first electrode layer, a second electrode layer, and an organic light emitting layer disposed between the first electrode layer and the second electrode layer. The switch component is disposed relative to the pixel unit, the switch component is used to turn on or turn off the corresponding pixel.

S204: forming a thin film package layer on the display unit layer. The thin film package layer is used to prevent moisture from entering into the flexible light emitting display.

The flexible organic light emitting display device and the method for manufacturing the same apply an additional organic insulating buffer layer between the flexible underlay substrate and the switch array layer on the conventional flexible underlay organic light emitting device. Because the organic insulating buffer layer weakens the bending deformation force during the bending process of the organic light emitting display, the damage of the bending deformation force is reduced greatly to prevent the metal electrode from being broken during the downward bending process when the bending deformation force is large, thereby enhancing the stability of the flexible organic light emitting display.

Figure 2:
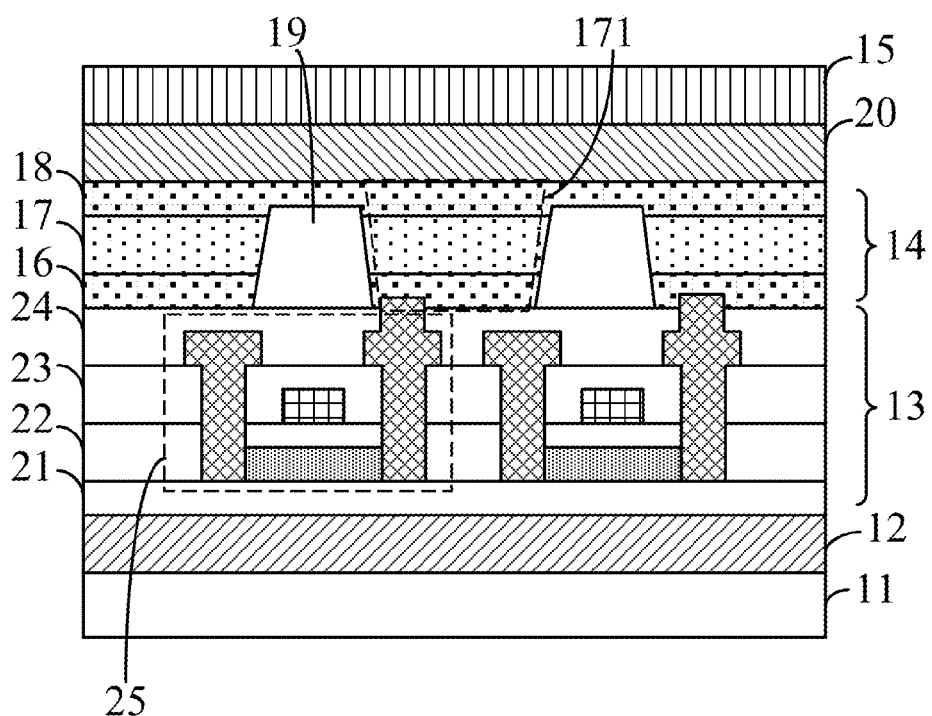
FIG. 2 is a structural schematic diagram of a flexible organic light emitting display according to a second embodiment of the present invention.

Please refer to FIG. 2, which is a structural schematic diagram of a flexible organic light emitting display according to a second embodiment of the present invention.

The difference between the present embodiment and the first embodiment is as follows:

A second buffer layer 20 is further disposed between the display unit layer 14 and the thin film package layer 15, where when the flexible organic light emitting display bends along the thin film package layer 20 (upward bending), a second bending deformation force is generated. The second buffer layer is used to absorb the second bending deformation force, and the material of the second buffer layer is an insulating material.

A pixel definition layer 19 is further disposed between two adjacent pixel units 171. The material of the pixel definition layer 19 can be preferably an organic insulating material. The thickness of the pixel definition layer can be 2.5 to 4 um. When the buffer layer is too thin, crosstalk between the two adjacent pixel units cannot be avoided efficiently, while a buffer layer which is too thick will affect the transmission of the display device.

Preferably, the organic insulating material is composed of a photosensitive agent and resin, so that the organic insulating material has better heat resistant performance and it is not damaged in the manufacturing process.

Preferably, the thickness of the first buffer layer or the second buffer layer can be 2-10 nm. A buffer layer which is too thin does not absorb the bending deformation force well; while one which is too thick affects the display result.

The first electrode, such as a pixel electrode, a material of which is indium tin oxide thin film. The thickness of the thin film is, for example, 50-100 nm. The material of the second electrode is metal. Preferably, it can be silver.

The thin film package layer is alternatively composed of multi-layer silicon oxide film and silicon nitride insulating film. The thin film package layer prevents moisture from entering into the flexible organic light emitting display.

The difference between the method for manufacturing the flexible organic light emitting display and the first embodiment is:

After forming the display unit layer on the switch array layer in step S203, without forming the thin film package layer directly, the steps are in particular:

S205: forming the second buffer layer on the display unit layer. When the flexible organic light emitting display bends along the thin film package layer, a second bending deformation force is generated. The second buffer layer is used to absorb the second bending deformation force, and the material of the second buffer layer is an insulating material.

S206: forming the thin film package layer on the second buffer layer. After step S205, the thin film package layer is formed.

S207: disposing the pixel definition layer between two adjacent pixel units. The material of the pixel definition layer is an organic insulating material, which is formed by adjusting a content ratio of the photosensitive agent and the resin.

Preferably, the thickness of the first buffer layer or the second buffer layer is 2-10 nm. A buffer layer which is too thin does not absorb the bending deformation force well; while one which is too thick affects the display result.

The flexible organic light emitting display and the method for manufacturing the same of the present invention apply an additional organic buffer layer between the flexible underlay substrate and the switch array on the conventional flexible organic light emitting display, as well as apply an additional organic buffer layer between the display unit layer and the thin film package layer. Because the organic insulating buffer layer weakens the bending deformation force during the bending process of the organic light emitting display, the damage of the bending deformation force is reduced greatly to prevent the metal electrode from being broken during the downward bending process when the bending deformation force is large. The present invention enhances stability of the flexible organic light emitting display.

The embodiments were chosen and described in order to explain the principles of the disclosure and their practical application so as to activate others skilled in the art to utilize the disclosure and various embodiments and with various modifications as are suited to the particular use contemplated. Alternative embodiments will become apparent to those skilled in the art to which the present disclosure pertains without departing from its spirit and scope. Accordingly, the scope of the present disclosure is defined by the appended claims rather than the foregoing description and the exemplary embodiments described therein.

What is claimed is:

1. A flexible organic light emitting display, comprising:
   a flexible underlay substrate;
   a first buffer layer disposed on the flexible underlay substrate;
   a switch array layer disposed on the first buffer layer, the switch array layer comprises at least two switch components;
   a display unit layer disposed on the switch array layer, the display unit layer comprises at least two pixel units, the pixel unit comprises a first electrode layer, a second electrode layer, and an organic light emitting layer disposed between the first electrode layer and the second electrode layer; the switch component being connected with the first electrode layer, the switch component being disposed relative to the pixel unit; and
   a thin film package layer disposed on the display unit layer;
   wherein when the flexible organic light emitting display bends along the thin film package layer, a second bending deformation force is generated, a second buffer layer is used to absorb the second bending deformation force, a material of the second buffer layer is an organic insulating material,
   wherein the second buffer layer is disposed between the display unit layer and the thin film package layer, and
   wherein when the flexible organic light emitting display bends along the thin film package layer, a first bending deformation force is generated, the first buffer layer is used to absorb the first bending deformation force, a material of the first buffer layer is an insulating material.

2. The flexible organic light emitting display as claimed in claim 1, wherein a pixel definition layer is disposed between the two neighboring pixel units, a material of the pixel definition layer is an organic insulating material.

3. The flexible organic light emitting display as claimed in claim 1, wherein the organic insulating material is composed of a photosensitive agent and resin.

4. The flexible organic light emitting display as claimed in claim 1, wherein a thickness of the first buffer layer is 2 to 10 nm.

5. The flexible organic light emitting display as claimed in claim 1, wherein a thickness of the second buffer layer is 2 to 10 nm.

* * * * *